United States Patent [19]

Brzozowski

[11] 4,075,051

[45] Feb. 21, 1978

[54] METHOD OF TRIMMING PHOTORESIST FILM

[75] Inventor: Paul Charles Brzozowski, Newark, Del.

[73] Assignee: E. I. Du Pont de Nemours and Company, Wilmington, Del.

[21] Appl. No.: 745,682

[22] Filed: Nov. 29, 1976

[51] Int. Cl.² .............................................. G03C 1/90
[52] U.S. Cl. ........................................ 156/236; 96/83; 156/238; 156/247
[58] Field of Search ................... 96/83; 156/230, 231, 156/234, 236, 238, 241, 247, 248, 249, 660, 344, 659

[56] References Cited

U.S. PATENT DOCUMENTS

| 1,930,291 | 10/1933 | Thornton | 96/83 X |
| 3,402,082 | 9/1968 | Seaman et al. | 156/660 |
| 3,649,283 | 3/1972 | Christensen et al. | 96/83 X |

*Primary Examiner*—William A. Powell

[57] ABSTRACT

The method of this invention forms a laminate of a coversheet, a photoresist film, a substrate and a soft absorbent backup sheet. A solvent or softening agent that will reduce the tear strength of the film is applied to the backup sheet. This weakens the photoresist surrounding the substrate. As the backup sheet is peeled away from the substrate, the weakened photoresist is pulled away with it and is torn or trimmed along the edges of the substrate. This facilitates precise and accurate trimming which is particularly useful on small fragile, irregular shaped substrates. The substrate may then be processed by exposure, development and the like.

6 Claims, 2 Drawing Figures

METHOD OF TRIMMING PHOTORESIST FILM

BACKGROUND OF THE INVENTION

This invention relates to a method of trimming a photoresist film and, more particularly, to a method of trimming a photoresist film, laminated to a substrate, along the edges of the substrate to facilitate further processing of the substrate-film laminate.

In the use of dry film photoresist materials, it is customary to laminate the film to a substrate which may be a circuit board or other surface to be processed. When using printed circuit boards and similar, relatively strong materials, particularly those having a well defined contour, it is customary to trim the board by running a razor blade or similar instrument along the edges thereof to cut away the excess film. In the case of fragile substrates, or substrates having an odd shape, such as is often the case in the field of microelectronics, when using silicon wafers and the like such manual trimming becomes not only tedious but also time consuming. In fact, such wafers are often damaged during trimming due to their fragility.

It is therefore an object of this invention to provide an improved method of trimming photoresist material from the edges of laminated substrates.

SUMMARY OF THE INVENTION

The preferred method of this invention is used in a process wherein a photoresist film supported by a coversheet is applied to a substrate by lamination. Trimming of the film along the edges of the substrate is accomplished by applying a film weakening agent to the substrate side of the film and separating the coversheet from the film in the region of the substrate. These steps may be performed in either order.

In a particularly preferred embodiment of the method of the invention, the weakening agent is applied to the film using a pliable, permeable sheet. The permeable sheet is laminated to the film forming a sandwich with the substrate in the middle. The permeable sheet is selected to have a wetted adhesive strength to the film that is greater than the wetted adhesive strength of the coversheet to the film. The weakening agent is then applied to the permeable sheet. After the weakening agent has contacted and weakened the film, the permeable sheet is separated from the substrate and the coversheet. Because of its higher adhesive strength to the permeable sheet, the weakened film is pulled off with the permeable sheet and tends to shear or cut along the edges of the substrate so as to conform to the substrate configuration.

If desired, after the coversheet is removed, the bare surface of the photoresist film may be protected with a suitable cover or coating. The substrate with the photoresist film adhereed thereto may then be processed using conventional handling equipment for the exposure and development of the film. Removal of the coversheet may take place before or after the weakening agent is applied. This unique method is particularly advantageous in that it permits relatively fragile, weak, irregular shaped substrates to be trimmed accurately, precisely, easily and without damage to the substrate. Such technique is particularly useful for the processing, for example, of silicon wafers.

BRIEF DESCRIPTION OF THE DRAWINGS

Further advantages and features of this invention will become apparent upon consideration of the following description wherein.

DETAILED DESCRIPTION OF THE PREFERRED EMBODIMENTS

The method of this invention will be described in conjunction with the processing of a fragile substrate such as a silicon wafer by laminating a photoresist film to the substrate, applying a weakening agent to the film and then trimming the photoresist film from the edges of the substrate.

The photoresist film employed in the invention may be of the type conventionally referred to as photopolymer film resists, or "dry film resists", which are applied by lamination. Such films, which will be hereinafter referred to as photoresist films, are capable of generating resist patterns after imagewise exposure to actinic radiation, by removal of various of the layers typically with the solvent. In the case of a negative-working material, the unexposed areas are removed and the exposed areas remain as the resist image. In the case of a positive-working material, the unexposed areas form the resist image.

Useful materials for the practice of the invention are described in U.S. Pat. Nos. 3,469,982 and 3,526,504. The photoresist resin may be an initially readily soluble, negative-working photohardenable layer (negative-working photoresist) or an initially poorly soluble photosolubilizable or photodesensitizable layer (positive-working photoresist).

Photohardenable materials are those which become hardened when exposed to actinic radiation and are preferably selected from photopolymerizable, photocrosslinkable and photodimerizable materials. Such materials are usually characterized by having ethylenically unsaturated or benzophenone-type groups and are described in U.S. Pat. Nos. 2,760,863; 3,418,295; 3,649,268; 3,607,264; and 3,622,334, for example.

Photosolubilizable and photodesensitizable materials are those which are solubilized or decomposed, rather than polymerized, in areas exposed to light. When the latter are removed, the unexposed areas remain on the surface as a durable positive resist. Such materials are disclosed in U.S. Pat. Nos. 3,778,270; 3,779,778; 3,782,939; and 3,837,860.

Photopolymer film resists, when used in the method of this invention, typically are supplied sandwiched between a layer of polyolefin and a layer of polyester film. The protective polyolefin separator sheet is peeled off the resist and the resist is laminated to the substrate. Lamination typically is achieved utilizing either pressure rolls or vacuum lamination techniques and heat. Reverse lamination techniques may also be used in which the polyester sheet is peeled off and the polyolefin protective sheet used as the "cover" sheet.

Figure 1:
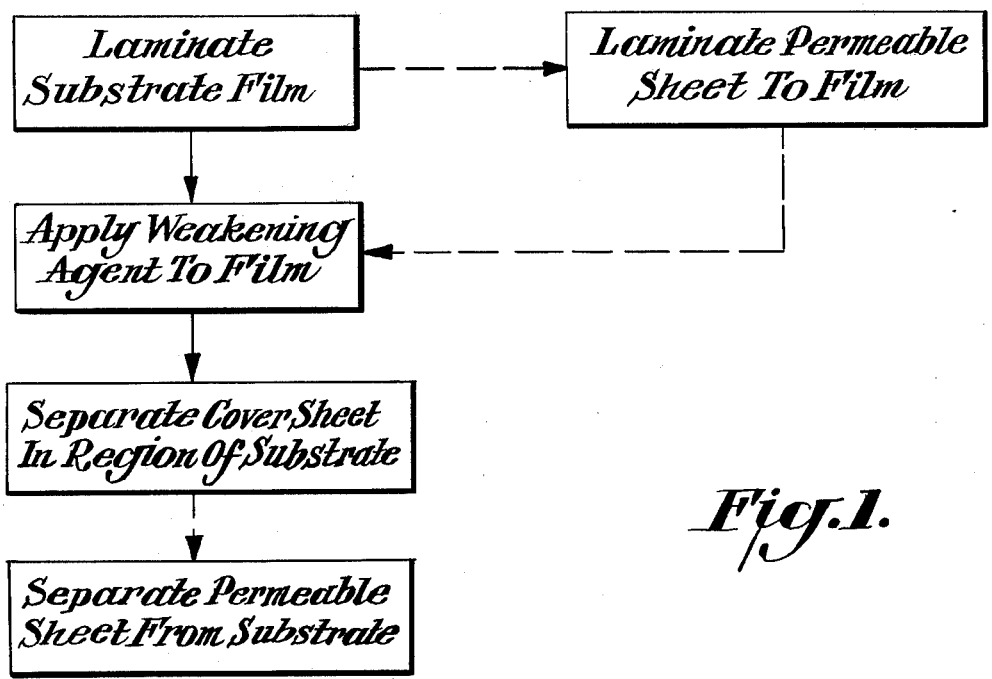
FIG. 1 is a block diagram depicting the steps of the method according to this invention.

According to the method of this invention, as depicted particularly in FIG. 1, a photoresist film is laminated to a substrate. The substrate may be a conventional printed circuit board or, in the preferred form or preferred use of the method, a material such as is typically used in microelectronics, i.e., a ceramic plate or silicon wafer. The invention finds particular use with ceramic plates or silicon wafers because of their typical irregular shapes and/or fragility. Such lamination may take place in a conventional laminator such as a roll laminator utilizing pressure and heat or a vacuum laminator. In the laminator, the separator sheet is peeled from the photoresist film and the substrate laminated to the now unprotected side of the film. To prevent the photoresist film from adhering to the rollers of the laminator or other surfaces in the laminator, a continuous polyolefin belt may be used to protect such surfaces.

Either in the laminator or upon preferably leaving the laminator, a weakening agent is applied to the unprotected side of the film (the side having the substrates adhereed thereto). The application of the weakening agent may be by a spray, by a roller saturated with the weakening agent, or by such other known fluid application means as desired. A spray tends to be preferred over a roller since it has less tendency to damage the substrate. After the film has left the laminator and after a sufficient time interval has elapsed for the weakening agent to reduce the tear strength or dissolve the portions of the film which it contacts, the coversheet is stripped from the film in the region of the substrate, i.e., that portion of film adhered to the substrate. The now softened and weakened film adheres to the coversheet and is removed or torn away at the edges of the substrate. Where it is protected by the substrate, the photoresist film remains strong and has a higher tensile or tear strength having not been subjected to the action of the weakening agent. If a solvent type weakening agent is used and the solvent allowed to dissolve the film it contacts, i.e., those regions not protected by the substrate, the result is substantially the same — the substrate with film adhered is accurately and precisely trimmed. The substrate may then be passed on to conventional wafer processing apparatus, as desired for exposure and development of the photoresist film. This method may also be used in double laminations. In this instance, the removal of either coversheet is sufficient to effect the trimming action leaving the other coversheet for support.

Among the weakening agents that may be used are any of those which will weaken the tensile or tear strength of the photoresist film. Among these are solvents for the photoresist. Any of the conventional solvents may be used as desired. Typical of such solvents are 1,1,1-trichloroethane, methylene chloride or for the semi-aqueous photoresist film, a solvent such as a mixture of water, 12% 2-butoxyethanol and 2% sodium borate. In addition various non-solvent, softening agents may be used that will tend to weaken the tensile or tear strength of the photoresist film. Among the suitable non-solvent sofenting agents that may be used are perchloroethylene, isopropanol, methanol, ethanol, kerosene, cyclohexane, heptane, fluorocarbons, and basic solutions (OH$^-$) for aqueous films.

The various time periods during which the photoresist film must be subjected to the action of the solvent or softening agent will vary according to the film thickness, film type and particular solvent or softening agent used. Following trimming, if the coversheet has been removed, it may be desirable to apply a non-tacky coating to the film. Such coating may be a sprayed on coating of any suitable material such as polyvinyl alcohol which can detackify the film surface and yet will not affect further processing of the photoresist film. Alternatively, a photoresist film could be used having a solvent removable protective layer. Films of this type are described, for example, in U.S. Pat. No. 3,458,311 issued July 29, 1969 to F. P. Alles. Such solvent removable protective layer can underlie the usual polyester coversheet such that the photoresist film used is a sandwich structure of the polyolefin protective sheet, the photoresist film, the solvent removable protective layer, and finally the polyester coversheet.

Figure 2:
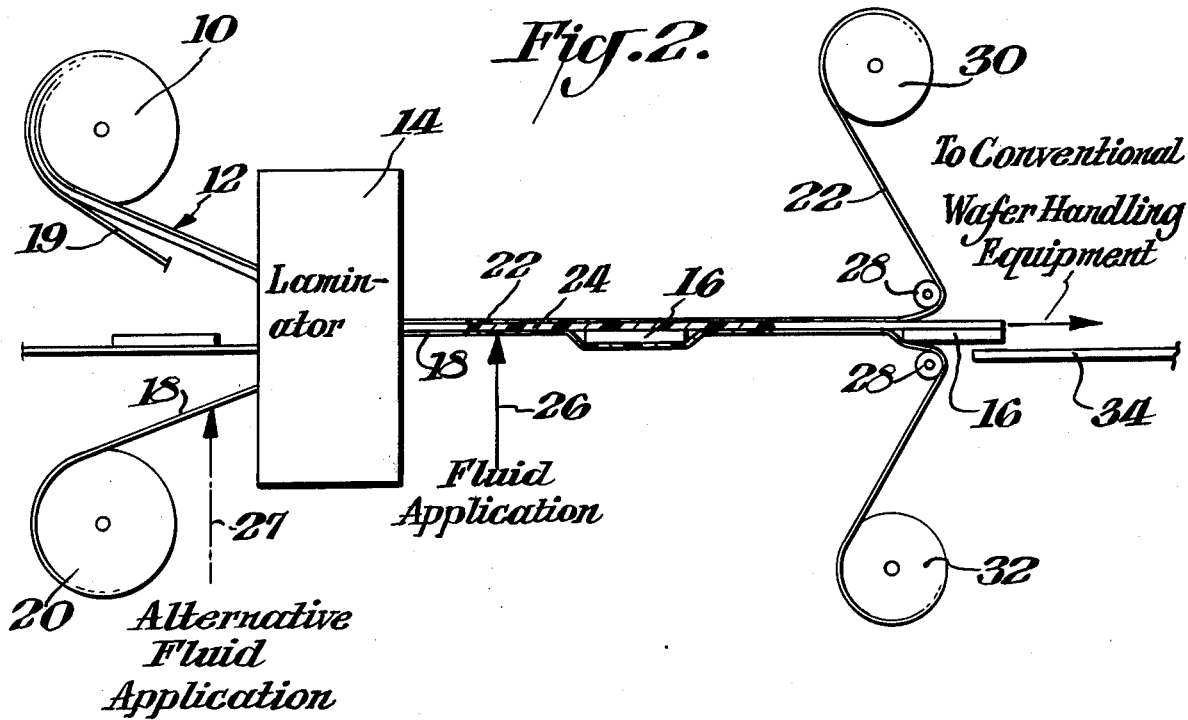
FIG. 2 is a diagrammatic representation of a preferred manner of performing the method of this invention.

Reference is now made to the sequence of FIG. 1 depicted by the dashed lines and to FIG. 2 in which the diagrammatic representation of an apparatus for performing the method of this invention is disclosed. In this particularly preferred embodiment, a feed roll 10 of conventional photoresist 12 having a polyester coversheet 22, a photoresist layer or film 24, and a polyolefin protective layer 19, is passed with the coversheet 22 side up through a conventional roll type laminator 14. The protective layer 19 is peeled away and wound on a take up roll (not shown) leaving the unprotected underneath side of the photoresist 12 free to adhere to the substrate. A substrate such as a ceramic plate or silicon wafer 16 is also fed into the laminator to be laminated onto the now unprotected, underneath side of the photoresist 12 between the film 24 and a pliable, permeable sheet 18 which may be dispensed from a feed roll 20.

Following lamination, there is seen to be a laminate comprising coversheet 22, the photoresist film 24, wafer 16 and permeable sheet 18. Upon leaving the laminator 14, a weakening agent is applied to the permeable sheet 18 at a point depicted by the arrow 26 and labeled "fluid application". The weakening agent may be any of those previously described. Upon being applied to the permeable material, the weakening agent permeates through the material and acts upon the photoresist film 24 thereby reducing its tensile or tear strength.

The pliable, permeable material 18 may be any porous, absorbent material that the photoresist film will stick or adhere to and which will permit the various weakening agents listed hereinbefore to pass through. Application of the fluid weakening agents may be made by spray, saturated roller, or other known means of applying fluids. After the web has moved a sufficient distance to allow time for the weakening agent to act upon the film 24, the laminate is passed through a pair of nip rolls 28. At this point, the coversheet 22 is peeled off and fed to a takeup roll 30 on the upper side; on the lower side the permeable sheet 18 is peeled back and fed to a takeup roll 32. The wafer will have its edges trimmed of the photoresist film by the action of the permeable sheet 18 pulling or tearing the weakened film along the edges of the wafer as it is peeled back. The wafer 16 now may be passed to a tray or movable belt 34 for passage to conventional wafer handling equipment.

If desired, the coversheet may be peeled back and removed prior to application of the weakening agent. In this instance, the non-tacky coating described above would be applied to the photoresist film. In fact, if the non-tacky coating is provided by a polyvinyl alcohol solution in water, the water itself will serve as the softening agent. Heating of the thus treated substrate may be used to reduce the process time.

The permeable sheet must, in its wetted condition, adhere to the film 24 more strongly than does the coversheet 22. Describing it in another way, the permeable sheet should have a wetted adhesive strength to the photoresist film 24 that is greater than the wetted adhesive strength of the coversheet 22 to the film.

Among the various permeable sheets that may be used are paper (ordinary paper towel type material may be used) or any other permeable material that has a sufficiently roughened or porous surface that will permit adherence to the photoresist film as described. Among such materials are a non-woven polyester sheet such as that sold under the Tradename REMAY ® or a non-woven polyolefin fiber such as sold under the Tradename TYVEK ®. Both are products of E. I. du Pont de Nemours and Company. In addition, cotton cloth, woolen cloth, linen and similar materials which are soft and absorbent may be used. The materials may be woven or non-woven so long as they meet the requirements of adherence to the photoresist film as set forth above. The only restriction placed upon the type of materials that may be used in that it should not dissolve to a significant degree in the weakening agents employed or have its own tensile strength reduced to less than the strength of the resist.

In still another alternative method, the weakening agent may be applied to the permeable sheet 18 prior to lamination, instead of after, say at the point as depicted by the phantomed arrow 27. The remainder of the method remains unchanged.

There is described in copending application U.S. Ser. No. 745,680, filed Nov. 29, 1976, simultaneously herewith a method of applying swelling agents to the substrate prior to the laminating step to swell the film and facilitate its conforming to contours on the surface of the substrate. The method of trimming the edges of substrates described herein has particular application to such liquid laminating method. Excess swelling agent squeezed off the substrate will permeate the permeable sheet and react and soften the photoresist film along the edges of the substrate permitting the trimming action described herein when the permeable sheet is removed.

EXAMPLE 1

In one method according to this invention a semiaqueous photoresist film Riston ® photopolymer resist film M-811, sold by E. I. du Pont de Nemours and Company, Wilmington, Delaware 1 mil thick was laminated to a silicon wafer with a paper towel backing. A softening agent of perchloroethylene was applied onto the porous material and allowed to remain for a period of one minute. Following this, the paper was peeled away from the wafer and coversheet. The result was that the softened photoresist film was torn accurately and precisely along the edges of the wafer without damage to the film remaining on the wafer and without damage to the wafer itself.

EXAMPLE 2

In another application of the method a solvent processable (Riston M-810, sold by E. I. du Pont de Nemours and Company, Wilmington, Delaware) photoresist film, 1 mil thick was used and subjected to the solvent methylene chloride for a period of one minute. Similar accurate trimming results were obtained when the paper backing was pulled away from the wafer.

The method is seen to facilitate the accurate trimming of fragile wafers, quickly and as an adjuvant to the photoresist film laminating process.

I claim:

1. In a method of applying a photoresist film supported by a coversheet to a substrate by laminating one side of said film to said substrate and trimming said film along the edges of said substrate, the improvement of:
   applying a film weakening agent to those portions of the substrate side of said film that are unprotected by said substrate, and
   separating said coversheet from said film in the region of said substrate in either order.

2. A method according to claim 1 wherein said agent is a solvent or non-solvent softening agent for said film.

3. In a method of applying a photoresist film supported by a coversheet to a substrate by laminating one side of said film to said substrate and trimming said film along the edges of said substrate, the improvement of:
   applying a film weakening agent to the substrate side of said film by laminating a pliable, permeable sheet to said film forming a laminate with said substrate in the middle, said permeable sheet having a wetted adhesive strength to said film that is greater than the wetted adhesive strength of said coversheet to said film,
   applying said weakening agent to said permeable sheet, and
   separating said permeable sheet from said substrate and said coversheet.

4. A method according to claim 3 wherein said weakening agent is a solvent or non-solvent softening agent for said film.

5. A method according to claim 4 wherein said coversheet and said permeable sheet are simultaneously separated.

6. A method according to claim 4 wherein only said permeable sheet is separated.

* * * * *